(12) United States Patent
Park

(10) Patent No.: US 6,979,614 B2
(45) Date of Patent: Dec. 27, 2005

(54) SEMICONDUCTOR MEMORY DEVICE AND METHOD OF MANUFACTURING THE SAME

(75) Inventor: Je-Min Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/135,774

(22) Filed: May 23, 2005

(65) Prior Publication Data

US 2005/0224854 A1 Oct. 13, 2005

Related U.S. Application Data

(62) Division of application No. 10/852,826, filed on May 24, 2004, now Pat. No. 6,917,067.

(30) Foreign Application Priority Data

May 26, 2003 (KR) .............................. 2003-33347

(51) Int. Cl.⁷ .................... H01L 21/8242; H01L 21/20
(52) U.S. Cl. ..................................... 438/253; 438/396
(58) Field of Search ............................... 438/253–254, 438/396–398; 257/295–310

(56) References Cited

U.S. PATENT DOCUMENTS

| | | | |
|---|---|---|---|
| 6,080,620 A * | 6/2000 | Jeng ........................... | 438/253 |
| 6,150,213 A * | 11/2000 | Luo et al. .................... | 438/253 |
| 6,255,160 B1 * | 7/2001 | Huang ......................... | 438/253 |
| 6,303,430 B1 * | 10/2001 | Jenq ............................ | 438/253 |
| 6,426,255 B1 | 7/2002 | Asano et al. | |
| 6,433,381 B2 | 8/2002 | Mizutani et al. | |
| 6,777,305 B2 * | 8/2004 | Lee et al. ................... | 438/396 |

FOREIGN PATENT DOCUMENTS

JP 10-233445 9/1998

OTHER PUBLICATIONS

English language abstract of Japanese Publication No. 10-233445.

* cited by examiner

Primary Examiner—Cuong Nguyen
(74) Attorney, Agent, or Firm—Marger Johnson & McCollom, P.C.

(57) ABSTRACT

In one embodiment, a plurality of contact holes are formed using an self-aligned contact (SAC) process to expose active regions. When storage node contact or BC pads are formed in the contact holes, a conductive layer is partially filled in the contact holes to expose the sidewall of an interlayer insulating layer pattern over the BC pads. The exposed sidewall of the interlayer insulating layer pattern is covered with an etch stop spacer. Also, the top surface of the interlayer insulating layer pattern is covered with an etch stop layer. Then, a plurality of bit line contact or BC plugs are formed to contact the tops of the BC pads. A protruded region, which extends in one direction, is preferably formed on the sidewall of the contact plug.

11 Claims, 7 Drawing Sheets

SEMICONDUCTOR MEMORY DEVICE AND METHOD OF MANUFACTURING THE SAME

This application is a Divisional of U.S. patent Ser. No. 10/852,826, filed on May 24, 2004, now U.S. Pat. No. 6,917,067, which claims priority from Korean Patent Application No. 2003-33347, filed on May 26, 2003, which are hereby incorporated by reference in their entirety.

BACKGROUND OF THE INVENTION

1. Field of the Invention

The present invention relates to a semiconductor memory device and a method of manufacturing the same. More particularly, the present invention relates to a semiconductor memory device including capacitor lower electrodes, and a method of manufacturing the same.

2. Description of the Related Art

As there is an increase in the integration density of semiconductor devices, the design rule decreases and thus the area occupied by each memory cell in a semiconductor memory device is scaled down. In a dynamic random access memory (DRAM), a capacitor used in a memory cell occupies a smaller area but requires the minimum capacitance enough to provide generally allowable data input and output characteristics and data reproduction characteristics. Thus, to manufacture a capacitor that maintains the minimum capacitance in a reduced space, a variety of lower electrodes having a 3-dimensional shape and an increased height have been proposed. Among them, a cylindrical lower electrode is broadly used because it can highly increase the effective area of a capacitor. In particular, more attention is paid to a capacitor-over-bit line (COB)-type cylindrical lower electrode.

With a reduction in the memory cell area, bottom critical dimension (CD) of a cylindrical lower electrode of a capacitor substantially decreases. Thus, the lower electrode is highly likely to fall down. Because the distance between adjacent lower electrodes is very narrow due to the reduced cell area, merely the slight leaning of the lower electrode may lead it to contact the next lower electrode, thereby causing a twin bit failure. To prevent the leaning of the lower electrode, the bottom CD of a capacitor should be increased or the height of the lower electrode should be decreased. However, if a desired design rule is predetermined, the bottom CD cannot be increased greater than the design rule. Also, if the height of the lower electrode is reduced, a sufficient capacitance cannot be obtained.

Recently, a variety of attempts have been made to change arrangement or sectional shape of lower electrodes to overcome the foregoing restrictions. However, in these cases, an active region of a semiconductor substrate can deviate from the position of a lower electrode. Thus, securing a sufficient contact margin for electrical connection of the lower electrode with the active region has been difficult.

On the other hand, a buried contact (BC) plug, i.e., a storage node contact, formed for electrical connection of an active region with a lower electrode should have has an appropriate size to reduce contact resistance. However, in a COB-type structure, the distance between the BC plug and a bit line is too short to secure a sufficient misalignment margin therebetween. For this reason, the BC plug and the bit line are formed by a self-aligned contact (SAC) process using an etch selectivity between oxide and nitride. When the SAC process is performed to form a contact, to secure a sufficient contact margin for electrical connection between the active region and the lower electrode, the design should be appropriately modified depending on the layout of the contact. In particular, if a hole-type contact is to be formed using the SAC process, it is difficult for a conventional method to provide a sufficient contact margin for electrical connection of an active region with a lower electrode.

SUMMARY OF THE INVENTION

In one embodiment, a semiconductor memory device comprises a semiconductor substrate having a plurality of active regions defined therein and a plurality of gate lines extending across the plurality of active regions. The plurality of gate lines include at least two adjacent gate lines. The device further includes a capping layer covering top surfaces and sidewalls of the gate lines, a plurality of contact pads contacting the active regions between the at least two adjacent gate lines, a first interlayer insulating layer pattern disposed between the plurality of gate lines, and a second interlayer insulating layer pattern disposed overlying the capping layer and the first interlayer insulating layer pattern. The second interlayer insulating layer pattern may have a plurality of contact holes therethrough to expose top surfaces of the contact pads. The device also includes a first etch stop layer pattern covering the top surface of the second interlayer insulating layer pattern, a second etch stop layer pattern disposed over a portion of the contact pad to cover the sidewall of the second interlayer insulating layer pattern, and a plurality of contact plugs extending through the contact holes to contact the top surfaces of the contact pads. Preferably, the first and second etch stop layer patterns each have an etch selectivity with respect to the second interlayer insulating layer pattern.

According to another aspect of the present invention, a method of manufacturing a semiconductor memory device is disclosed. The method preferably includes providing a semiconductor substrate having a plurality of active regions defined therein; forming a plurality of gate lines extending across the plurality of active regions on the semiconductor substrate, wherein top surfaces and sidewalls of the gate lines are covered with a capping layer; forming a first interlayer insulating layer to fill spaces between the gate lines; forming a second interlayer insulating layer overlying the first interlayer insulating layer and the capping layer; forming a first etch stop layer pattern on the second interlayer insulating layer to form openings to expose portions of the second interlayer insulating layer; forming a plurality of contact holes exposing the active regions by etching the second interlayer insulating layer and the first interlayer insulating layer using the first etch stop layer pattern as an etch mask; forming a plurality of contact pads contacting the active regions by partially filling the plurality of contact holes with a conductive layer; forming a second etch stop layer on the contact pads to cover sidewalls of the second interlayer insulating layer exposed in the contact holes; and forming a plurality of contact plugs to contact the tops of the contact pads.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
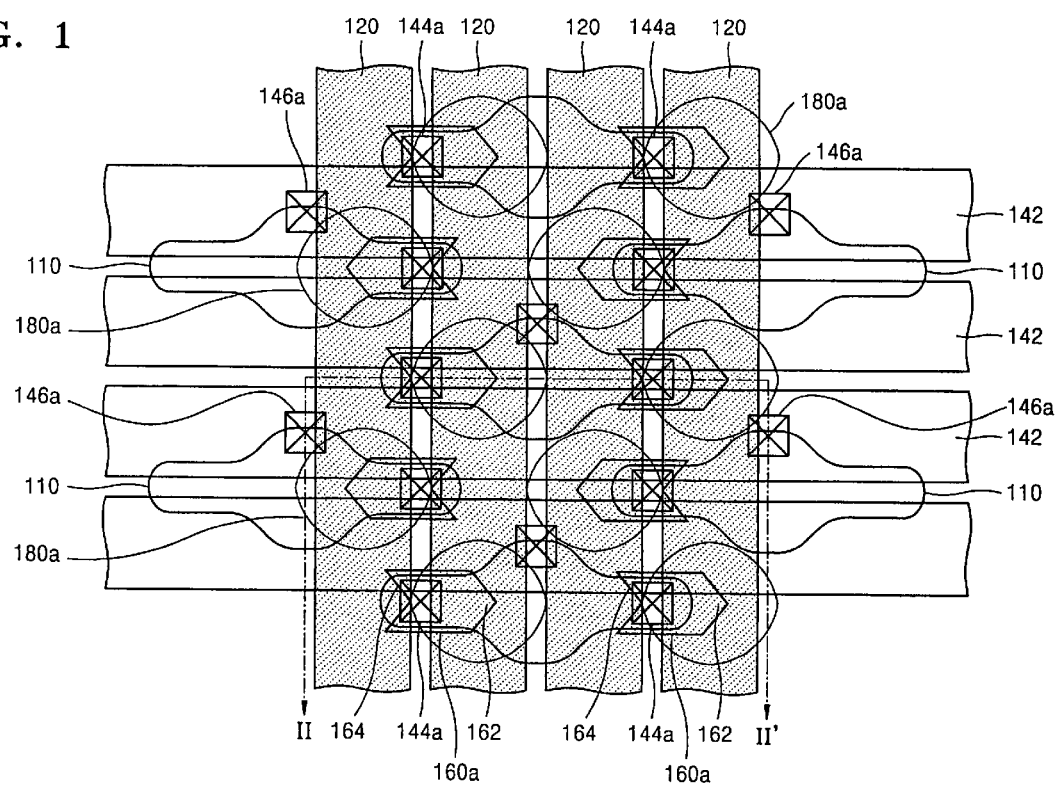
FIG. 1 is a layout of a cell array region included in a semiconductor memory device according to an embodiment of the present invention.
Figure 2:
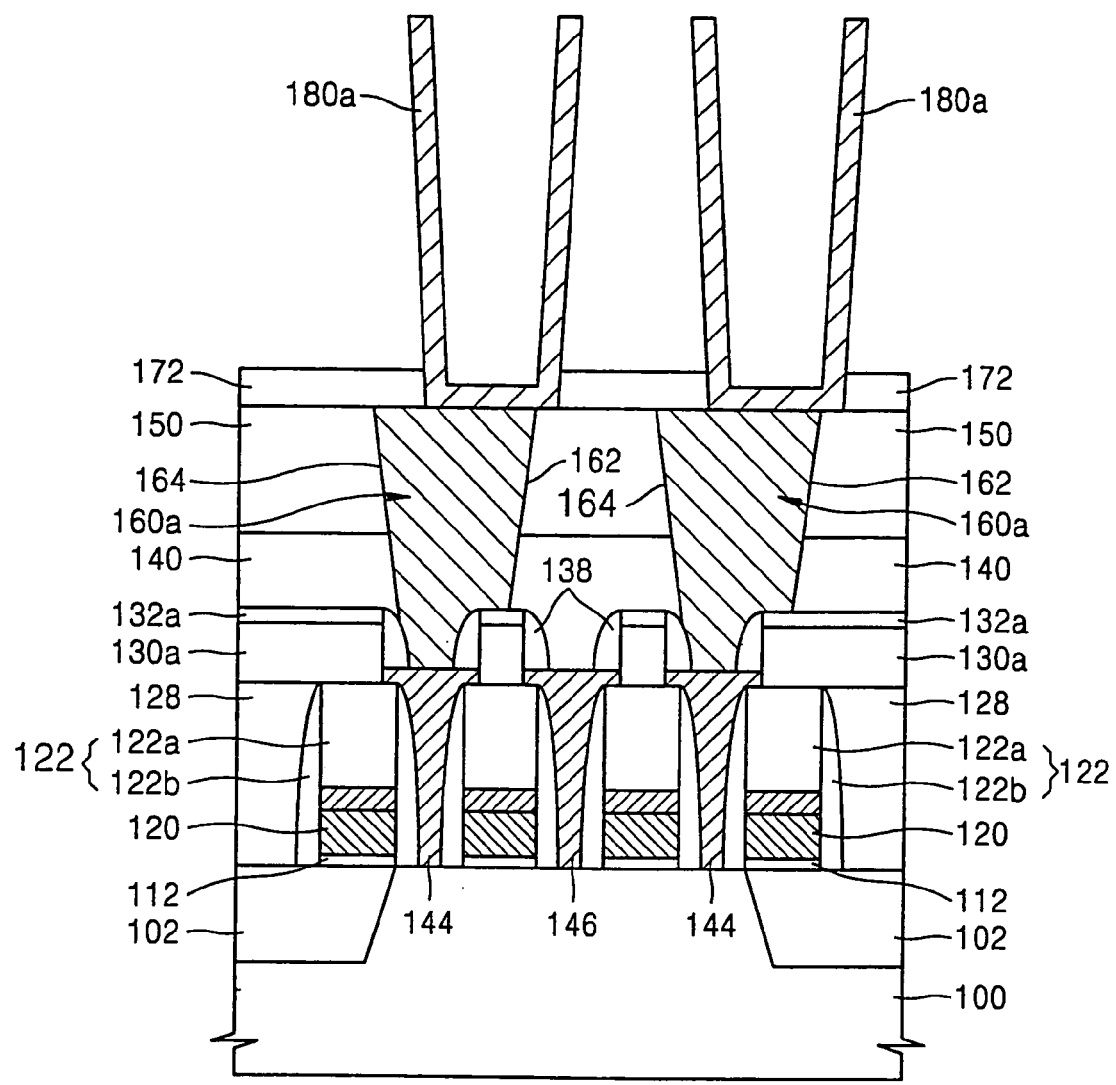
FIG. 2 is a cross-sectional view of the cell array region, taken along line II–II' of FIG. 1.

FIG. 1 is a layout of a cell array region included in a semiconductor memory device according to an embodiment of the present invention, and FIG. 2 is a cross-sectional view taken along line II–II' of FIG. 1.

Referring to FIGS. 1 and 2, a semiconductor memory device of the present invention comprises a plurality of active regions 110, which extend in a horizontal direction on a semiconductor substrate 100. A plurality of gate lines 120 extend on the active regions 110 in a direction that is approximately at right angles to the extended direction of the active regions 110. A plurality of buried contact pads 144 contact the active regions between two adjacent gate lines among the plurality of gate lines 120. Through contacts 144a formed by the buried contact pads 144, capacitor lower electrodes 180a are electrically connected to the active regions 110. Also, a plurality of bit lines 142 extend in the same direction as the extended direction of the active regions 110. Direct contact (DC) pads 146 are formed between gate lines 120, and the bit lines 142 are electrically connected to the active regions through contacts 146a formed by the DC pads 146. The lower electrodes 180a are formed on the bit lines 142.

A nitride layer 122 may cover the tops and sidewalls of the gate lines 120. The nitride layer 122 preferably includes a capping insulating layer 122a covering the tops of the gate lines 120 and insulating spacers 122b covering the sidewalls of the gate lines 120. The nitride layer 122 is preferably used for electrical isolation of the gate lines 120 from the BC pads 144 and the DC pads 146.

An insulating layer pattern such as an oxide pattern 130a, i.e., an interlayer dielectric (ILD), is disposed over the gate lines 120 to cover the capping insulating layer 122a. A plurality of holes are formed in the oxide pattern 130a to expose the tops of the BC plugs 144. A plurality of BC plugs 160a penetrate the oxide pattern 130 through the plurality of holes and contact the tops of the BC pads 144. The top of the oxide pattern 130a is covered with a nitride pattern 132a, and the sidewall thereof is covered with a nitride spacer 138 formed on the BC pads 144. Each BC plug 160a has a protruded region 162, which is disposed on the lateral surface of the BC plug 160 and extends in a horizontal direction over the nitride pattern 132a. The protruded region 162 is disposed on one of two gate lines 120 on both sides of the BC plug 160a. Also, the BC plug 160a has a recessed region 164 adjacent to the other of the two gate lines 120 on both sides of the BC plug 160a. The recessed region 164 has a shape corresponding to that of the protruded region 162. Since the top and sidewall of the oxide pattern 130a are covered with the nitride pattern 132a and the nitride spacer 138, respectively, the BC plug 160a can be easily shifted from the BC pad 144 due to the protruded region 162 formed on the BC plug 160a.

As shown in FIG. 1, the plurality of BC plugs 160a include a series of BC plugs 160a, which are arranged in one column in a vertical direction, and protruded regions 162 of the series of BC plugs 160 disposed in the vertical direction are arranged to extend in an opposite direction from protruded regions 162 of adjacent BC plugs 160a. Also, the plurality of BC plugs 160a include a series of BC plugs 160a, which are arranged in one row in a horizontal direction, and protruded regions 162 of the series of BC plugs 160 disposed in the horizontal direction are arranged to extend in the same direction as protruded regions 162 of adjacent BC plugs 162.

The plurality of lower electrodes 180a respectively contact the BC plugs 160a and are arranged to be in a zigzag pattern, when viewed from the plan view.

Figure 3:
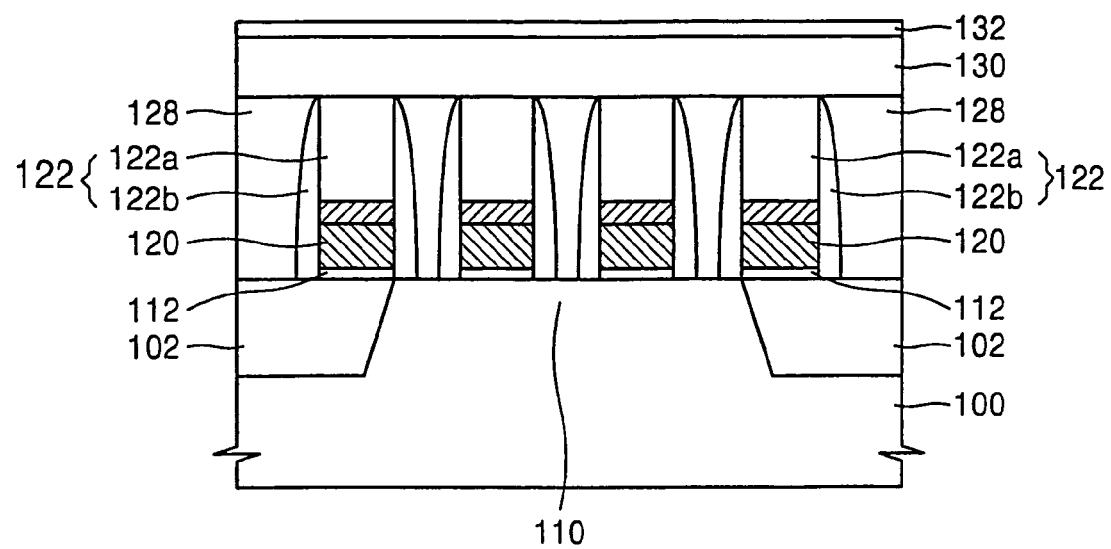
FIGS. 3 through 10 are cross-sectional views illustrating a method of manufacturing a semiconductor memory device according to various embodiments of the present invention.

Referring to FIG. 3, isolation regions 102 are formed in a semiconductor substrate 100 by, for example, a shallow trench isolation (STI) technique to define an active region 110. When viewed from the plan view, the active region 110 extends in a horizontal direction as shown in FIG. 1. Thereafter, a gate insulating layer 112 is formed on the semiconductor substrate 100, and a plurality of gate lines 120 are formed thereon to extend in a direction that is approximately at right angles to the extended direction of the active region 110. Each gate line 120 may have a polycide structure formed of a conductive polysilicon layer and a metal silicide layer, which are sequentially stacked. Here, the top of the gate line 120 is covered with a capping insulating layer 122a formed of, for example, nitride and then patterned. The sidewall of the gate line 120 is covered with an insulating spacer 122b formed of, for example, nitride. That is, the top and sidewall of the gate line 120 are covered with the capping insulating layer 122a and the insulating spacer 122b, respectively.

A first ILD 128 is formed to fill gap regions between the gate lines 120. The first ILD 128 is formed of an oxide having a good gap filling characteristic, for example, high density plasma (HDP) oxide and borophosphosilicate glass (BPSG). Next, an oxide layer is deposited to cover the first ILD 128 and the capping insulating layer 122a and then planarized, thereby forming a second ILD 130. Then, a nitride layer 132 is preferably formed on the second ILD 130 to a thickness of about 50 Å to about 500 Å. The nitride layer 132 may be an etch stop layer.

Figure 4:
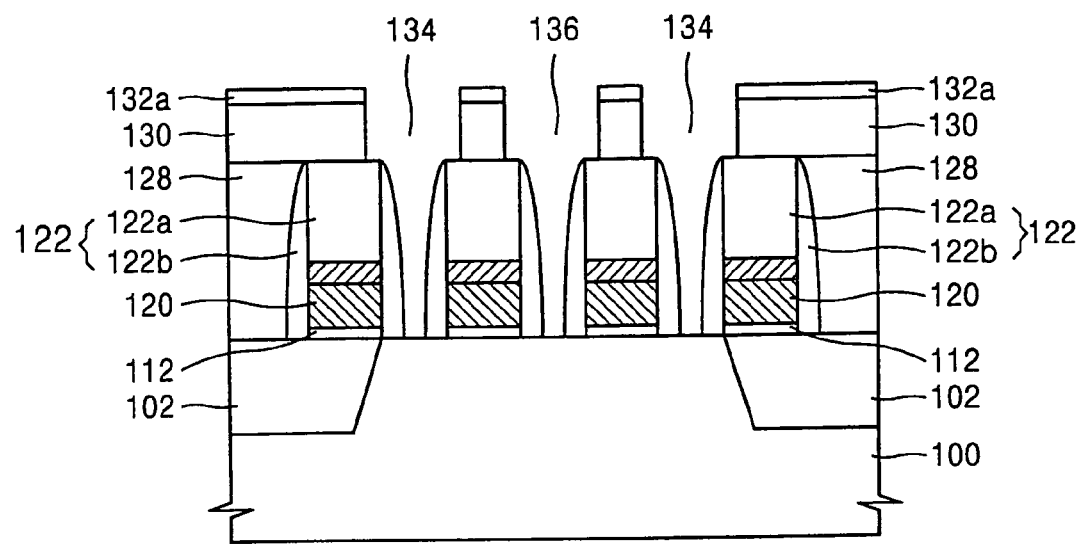

Referring to FIG. 4, the nitride layer 132 is patterned to form a nitride pattern 132a including holes exposing portions of the second ILD 130. By using the nitride pattern 132a as an etch mask, the second ILD 130 and the first ILD 128 are etched through an SAC process using an etch selectivity between oxide and nitride. As a result, a plurality of contact holes 134 and 136 are formed to expose the active region 110.

Figure 5:
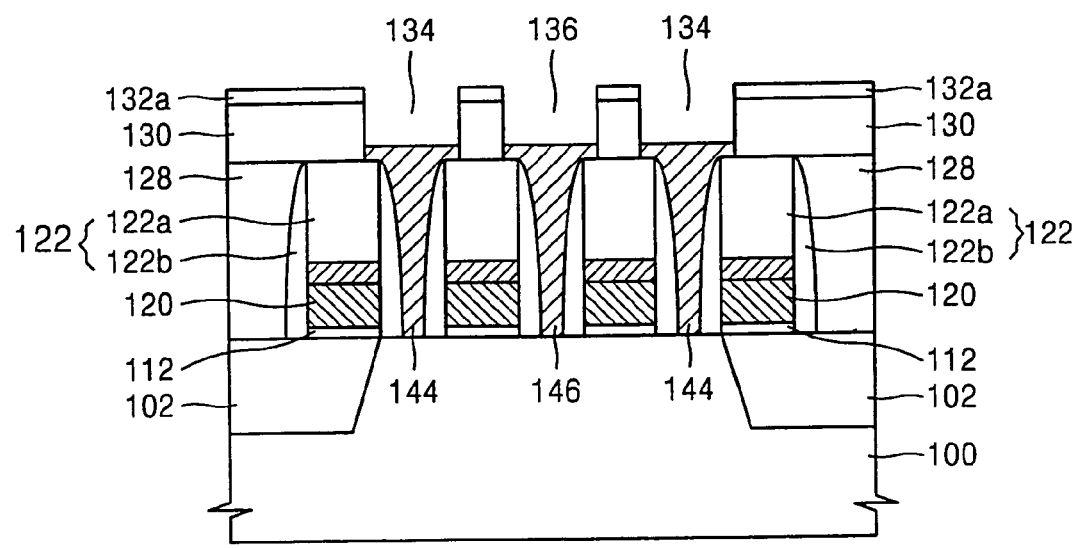

Referring to FIG. 5, a conductive layer is formed to fill the plurality of contact holes 134 and 136 and etched again by, for example, an etchback process until the contact holes 134 and 136 are formed again to a predetermined depth, thereby forming a plurality of contact pads 144 and 146 which partially fill the contact holes 134 and 136. Here, the conductive layer is etched back to a depth of about 200 Å to about 2,000 Å such that the tops of the contact pads 144 and 146 are disposed to a depth of about 200 Å to about 2,000 Å from the top of the contact holes 134 and 136.

The contact pad 144 is a buried contact (BC) pad or storage node contact pad, which is formed to connect a capacitor with the active region 110, and the contact pad 146 is a direct contact (DC) pad or bit line contact pad, which is formed to connect a bit line with the active region 110. The contact pads 144 and 146 may comprise conductive polysilicon.

Figure 6:
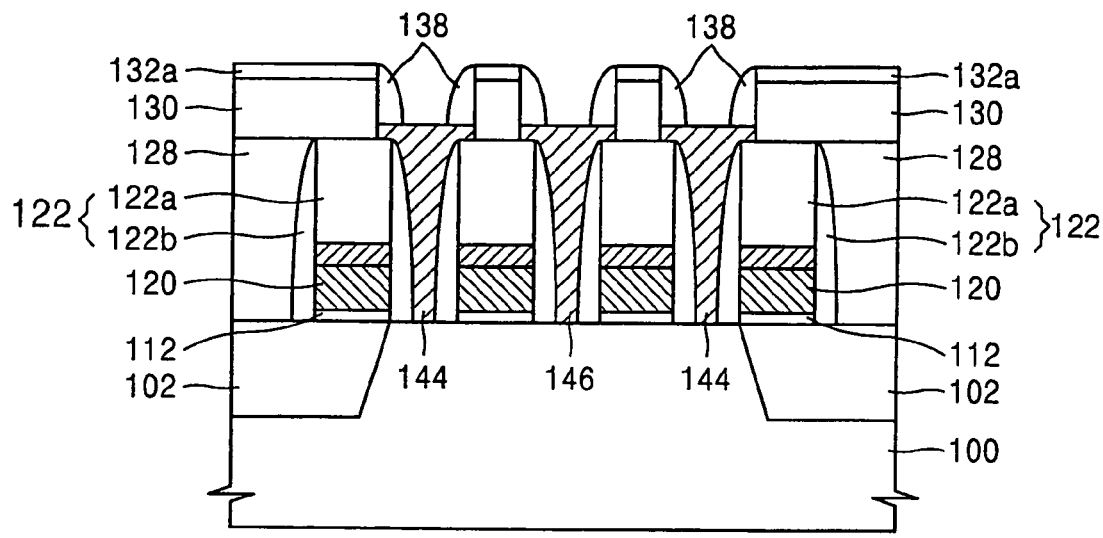

Referring to FIG. 6, a nitride layer is preferably formed on the resultant structure where the contact pads 144 and 146 are formed and then etched by an etchback process. Thus, nitride spacers 138 are formed over the contact pads 144 and 146 to cover portions of the second ILD 130, which are exposed by the contact holes 134 and 136. Here, the nitride spacers 138 cover the second ILD 130 to a thickness of about 50 Å to about 500 Å. The nitride spacers 138 may be an etch stop layer.

Figure 7:
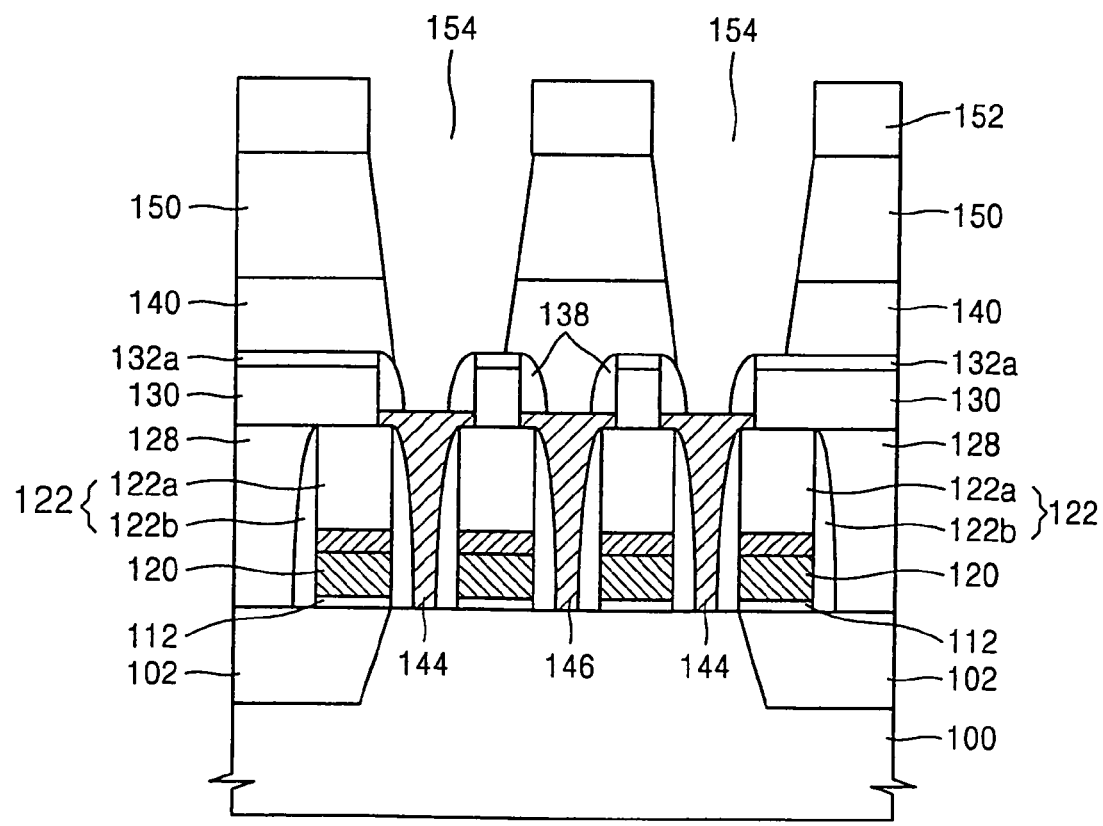

Referring to FIG. 7, a third ILD 140 is formed on the nitride pattern 132a and the nitride spacers 138, a plurality of bit lines 142 are formed to be connected to the contact pad 146 and extend in a horizontal direction (refer to FIG. 1), and a fourth ILD 150 is formed on the resultant structure. Thereafter, the fourth ILD 150 and the third ILD 140 are patterned using a photolithography process, thereby forming a plurality of openings 154 which expose the contact pads 144. Here, a photoresist pattern 152, which is used as an etch mask, extends in a zigzag pattern in the same direction as the extended direction of the gate line 120, i.e., in a vertical direction, when viewed from the plan view. Also, taper etching is used for forming the opening 154 in order to make the bottom CD of the opening 154 smaller than the beginning CD of the opening 154. By using the taper etching, only the contact pads 144 and a portion of the insulating pattern 132a adjacent to one contact pad 144 can be selectively exposed through the openings 154 without exposing the contact pad 146. Accordingly, after the fourth ILD 150 and the third ILD 140 are etched using the photoresist pattern 152 as an etch mask, the contact pads 144 and the portion of the insulating pattern 132a adjacent to one contact pad 144 are concurrently exposed through the openings 154. Since the top and sidewall of the second ILD 130 are covered with the nitride pattern 132a and the nitride spacer 138, respectively, the opening 154 can be sufficiently shifted from the contact pad 144.

Figure 8:
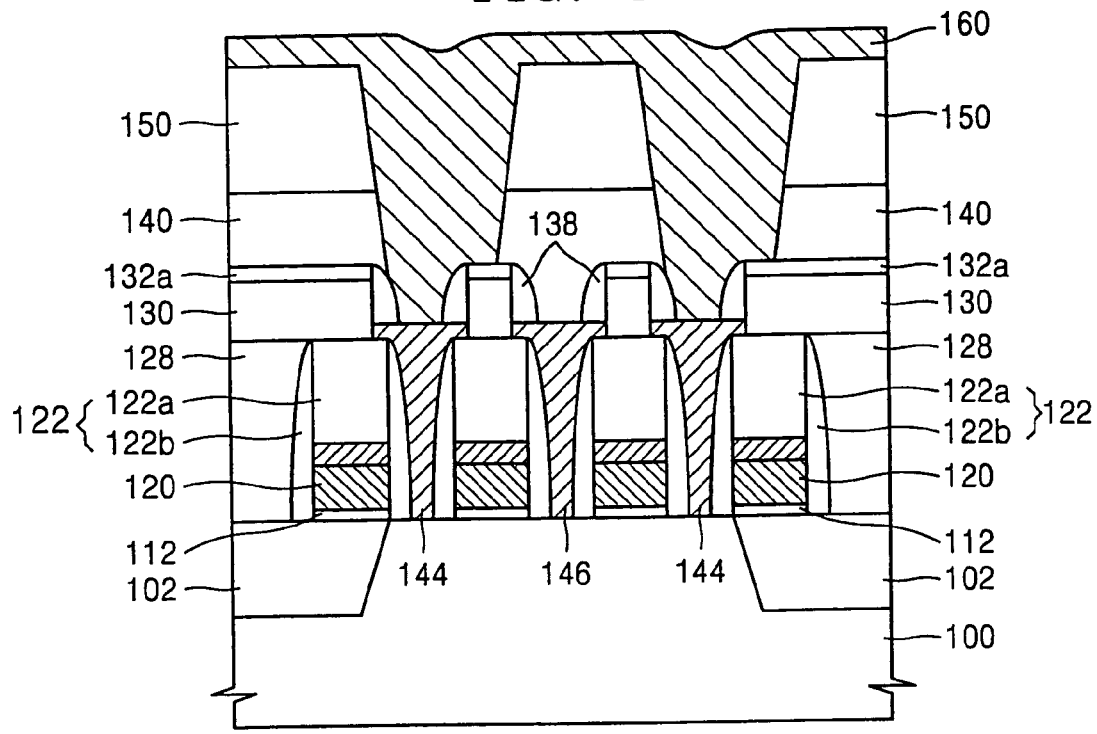

Referring to FIG. 8, the photoresist pattern 152 is removed, and then a conductive layer 160 is formed to fill the openings 154. The conductive layer 160 is formed of, for example, conductive polysilicon.

Figure 9:
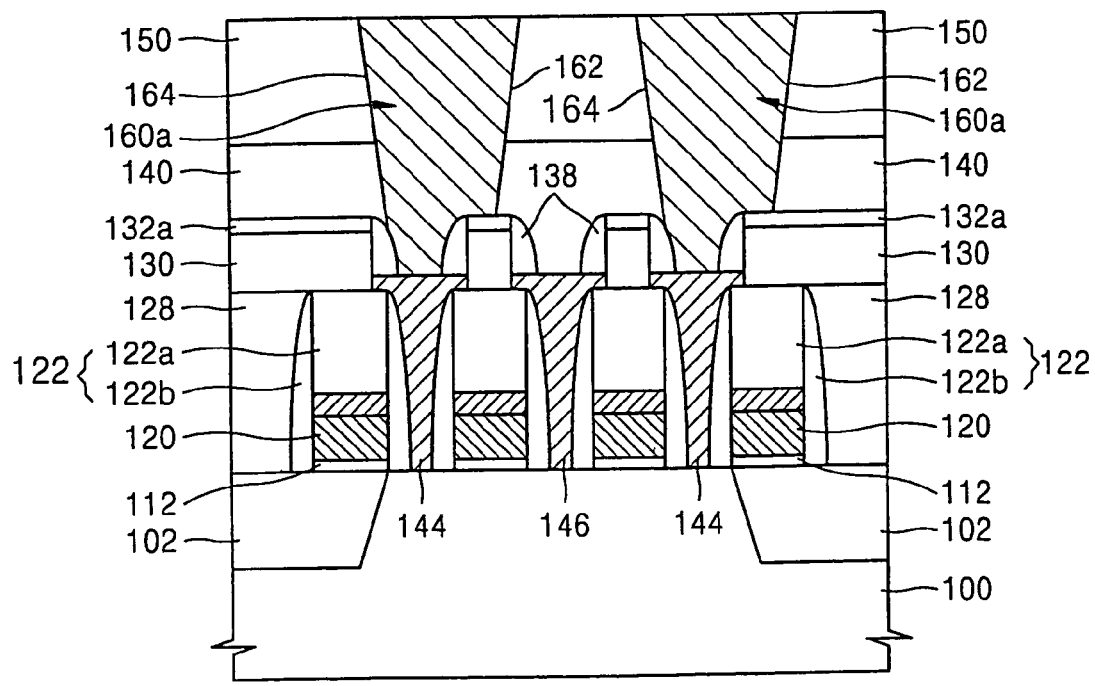

Referring to FIG. 9, the conductive layer 160 is partially removed using chemical mechanical polishing (CMP) until the fourth ILD 150 is exposed, thereby forming a plurality of BC plugs 160a which fill the openings 154. The CMP process may decrease the thickness of the fourth ILD 150. Each BC plug 160a has one protruded region 162 on its lateral surface. The protruded region 162 extends in the same direction as the extended direction of the active region 110, i.e., in the horizontal direction, over the nitride spacers 138 and the nitride pattern 132a. When viewed from the plan view, the protruded region 162 of the BC plug 160 overlaps one of the two gate lines 120 on both sides of the BC plug 160a. Also, the BC plug 160a has a recessed region 164 in an opposite direction of the protruded region 162, and the recessed region 164 has a shape corresponding to that of the protruded region 162. The recessed region 164 is adjacent to the other of the two gate lines 120 on both sides of the BC plug 160a. The position of the BC plug 160a can be shifted by a sufficient distance from the contact pad 144 due to the protruded region 162 of the BC plug 160a.

Figure 10:
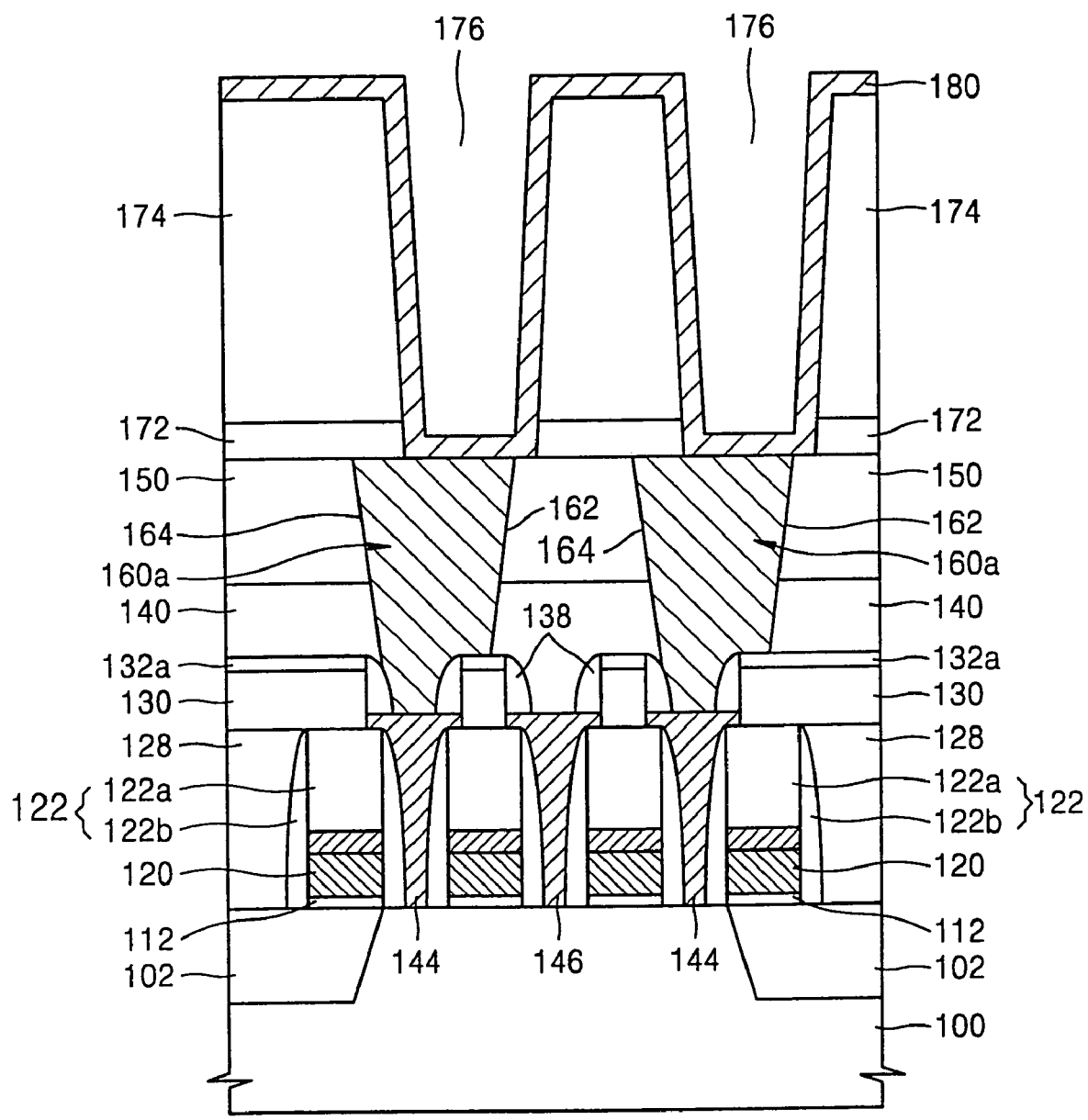

Referring to FIG. 10, a buffer layer 172 for an etch stopper and a sacrificial insulating layer 174 for a mold are sequentially formed on the fourth ILD 150 and the BC plug 162 and then sequentially patterned, thereby forming openings 176 where lower electrodes will be formed. The tops of the BC plugs 162 are exposed through the openings 176.

A conductive layer 180 for a lower electrode is uniformly formed on the exposed surfaces of the sacrificial insulating layer 174, the buffer layer 172, and the BC plug 160a to a thickness of about 400 Å to about 500 Å. The conductive layer 180 may comprise, for example, conductive polysilicon. Alternatively, if a metal-insulator-metal (MIM) capacitor is to be manufactured, the conductive layer 180 may be a metal layer.

Thereafter, a sacrificial insulating layer (not shown) is formed on the conductive layer 180 to a thickness of about 3,000 Å to about 6,000 Å and then planarized, thereby forming a plurality of cylindrical lower electrodes 180a as shown in FIG. 2. The plurality of lower electrodes 180a are formed to have a square-type sectional shape. Substantially, even if the lower electrode 180a is designed to have a square shape, the resulting lower electrode 180a has rounded edges as shown in FIG. 1. Also, as shown in FIG. 1, the plurality of lower electrodes 180a contact the BC plugs 160a and also are arranged to be in a zigzag pattern in the horizontal and vertical directions, when viewed from the plan view. Since the plurality of lower electrodes 180a are arranged to be in a zigzag pattern, a sufficient distance can be secured between the lower electrodes 180a. Accordingly, the problems of the prior art, such as the leaning of lower electrodes and a twin bit failure, can be effectively prevented.

The semiconductor memory device of the present invention includes cylindrical lower electrodes having an increased height so as to provide a sufficient capacitance in a relatively small memory cell area. To prevent the leaning of the lower electrodes and a twin bit failure caused by the increased height of the lower electrodes, the lower electrodes are arranged to be in a zigzag pattern, when viewed from the plan view. When the lower electrodes are disposed to be in a zigzag pattern, a sufficient contact margin can be secured for electrical connection of an active region with a lower electrode by forming a protruded region on the sidewall of a BC plug so that the BC plug can extend in a desired direction.

Further, according to one feature of the present invention, a BC plug may be formed on a BC pad formed using an SAC process. In this case, even if the BC pad has a hole shape, the top and sidewall of an insulating layer pattern defining the hole shape are covered with a nitride layer, and then the BC plug is formed thereon. Therefore, the position of the BC plug can be shifted from the BC pad by a sufficient distance due to a protruded region of the BC plug. Consequently, a sufficient contact margin can be secured between the BC pad connected to an active region and a capacitor lower electrode formed on the BC plug.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a semiconductor memory device, the method comprising:

providing a semiconductor substrate having a plurality of active regions defined therein;

forming a plurality of gate lines extending across the plurality of active regions on the semiconductor substrate, wherein top surfaces and sidewalls of the gate lines are covered with a capping layer;

forming a first interlayer insulating layer pattern to fill spaces between the plurality of gate lines;

forming a second interlayer insulating layer pattern overlying the first interlayer insulating layer pattern and the capping layer;

forming a first etch stop layer pattern on the second interlayer insulating layer to form openings to expose portions of the second interlayer insulating layer;

forming a plurality of contact holes exposing the active regions by etching the second interlayer insulating layer and the first interlayer insulating layer, using the first etch stop layer pattern as an etch mask;

forming a plurality of contact pads contacting the active regions by partially filling the plurality of contact holes with a conductive layer;

forming a second etch stop layer pattern on the contact pads to cover sidewalls of the second interlayer insulating layer exposed in the contact holes; and forming a plurality of contact plugs to contact top surfaces of the contact pads.

2. The method of claim 1, wherein the contact plug has a protruded region, which extends over the first etch stop layer pattern so as to overlap one of two gate lines on both sides of the contact plug.

3. The method of claim 2, wherein the contact plug has a recessed region adjacent to the other of the two gate lines, wherein the recessed region has a shape corresponding to that of the protruded region.

4. The method of claim 2, wherein the plurality of contact plugs include a series of contact plugs which are arranged in one column, wherein protruded regions of the contact plugs extend in an opposite direction from protruded regions of adjacent contact plugs among the contact plugs.

5. The method of claim 2, wherein the plurality of contact plugs include a series of contact plugs which are arranged in one row, wherein protruded regions of the series of contact plugs extend in the same direction as protruded regions of adjacent contact plugs among the contact plugs.

6. The method of claim 1, wherein the formation of the contact pads comprises substantially completely filling the contact holes with a conductive material and removing a portion of the conductive material by a predetermined depth until only the contact pads remain in the contact holes.

7. The method of claim 6, wherein the predetermined depth ranges from about 200 Å to about 2000 Å.

8. The method of claim 1, wherein the first etch stop layer pattern is formed to a thickness of about 50 Å to about 500 Å.

9. The method of claim 1, wherein the second etch stop layer pattern covers the sidewalls of the second interlayer insulating layer to a thickness of about 50 Å to about 500 Å.

10. The method of claim 1, further comprising forming a plurality of lower electrodes, which respectively contact the contact plugs and are arranged in a zigzag pattern.

11. The method of claim 10, further comprising forming a plurality of bit lines extending in the first direction over the gate lines, wherein the plurality of lower electrodes are formed over the bit lines.

* * * * *